United States Patent
Sakamoto

[11] Patent Number: 5,902,369
[45] Date of Patent: May 11, 1999

[54] CARBON COATED METALLIC MOLD FOR MAKING A GLASS PLATE

[76] Inventor: Yasuaki Sakamoto, 23-43 Harinokimata, Amarubecho, Kameoka-si, Kyoto-hu, Japan

[21] Appl. No.: 08/943,204

[22] Filed: Oct. 3, 1997

Related U.S. Application Data

[63] Continuation of application No. 08/669,996, Jun. 25, 1996, which is a continuation-in-part of application No. 08/520,585, Aug. 29, 1995, abandoned, which is a continuation-in-part of application No. 08/441,411, May 15, 1995.

[51] Int. Cl.$^6$ .............................. C03B 13/16; C03B 23/02
[52] U.S. Cl. ....................... 65/287; 65/374.12; 65/374.15
[58] Field of Search ................................ 428/1, 336, 408, 428/469, 216, 217; 65/287, 305, 374.1, 374.2, 374.15

[56] References Cited

U.S. PATENT DOCUMENTS

| | | | |
|---|---|---|---|
| 5,155,005 | 10/1992 | Sata et al. ................................ | 430/257 |
| 5,380,349 | 1/1995 | Taniguchi et al. ........................ | 65/286 |
| 5,541,003 | 7/1996 | Nakayama ............................... | 428/408 |
| 5,707,717 | 1/1998 | Shibahara et al. ................... | 65/374.12 |
| 5,711,780 | 1/1998 | Taniguchi ................................. | 65/286 |

FOREIGN PATENT DOCUMENTS 49-51112  5/1974  Japan .

*Primary Examiner*—Peter Chin
*Assistant Examiner*—Jacqueline A. Ruller
*Attorney, Agent, or Firm*—Evenson, McKeown Edwards & Lenahan P.L.L.C.

[57] ABSTRACT

In advance of carbon coating, by injecting ion into the shaped surface of metallic mold made of super-hard materials, it becomes possible to increase the adhesiveness of the carbon coat onto the mold material, and to increase the life of the mold. In a metallic pressing mold with the required flatness secured by carbon coating on the surfaces, it is characterized in that the surface layer of the shaped surfaces is modified by ion injection in advance of carbon coating.

1 Claim, 1 Drawing Sheet

CARBON COATED METALLIC MOLD FOR MAKING A GLASS PLATE

This application is a continuation of Ser. No. 08/699,966, filed on Jun. 25,1996, which is a cip of 08/520,585, now abandoned which is a cip of 08/441,411, May 15, 1995.

BACKGROUND OF THE INVENTION

This invention relates to a mold for pressing glass plates for liquid crystals or Braun tubes which are useful for electronic calculators, computer and word processor monitors, and molded glass plates for photomasks pressed by using it.

Generally, plastic materials such as polycarbonate, acrylic, epoxy or olefin resin are used for base plates of this type of optical disk, however, the plastic materials have such disadvantages as deterioration by aging under high temperature and high humidity conditions, and limited memory capacity. Accordingly, glass which is hardly affected by environmental conditions has widely been used as material for optical disks.

The glass plates molded by a fusion method or a float method are cut into required shapes after inspection, annealed at a temperature of 300–500° C., and then treated to polish the edges and surface. It is well known that the surface treatment takes considerable time and labor. Also, as glass plates are washed with organic neutralizing agents and pure water after polishing, it was necessary to invest in expensive facilities for waste water treatment.

Recently, as is adopted in the field of small-sized caliber lens manufacturing, a similar molding process has been applied to glass plates which have been treated by the processes of cutting and annealing, and the molded glass plates obtained have satisfactory surface flatness. The pressing mold used in this method is made of a super-hard material on the surface of which graphite or amorphous diamond-type carbon is coated, and the flatness thereof is also highly accurate.

The carbon coating on the surface of the mold is to prevent any scratches on the surface of the molded glass plates, due to air pores remaining on the surface of the mold.

This carbon coat has the superior property of not wetting the glass surface and not adhering to it, but there is a drawback in that it is easy to peel off of the surface of the mold (for example, in the continuous glass molding process, it will peel off when it is used less than 10,000 times).

Therefore, after long-term research and development directed to this problem, the inventor has found and invented that the life of the mold can be greatly extended by performing ion sputtering on the surface of the super-hard material prior to the carbon coating. It is also found that mechanical characteristics such as anti-friction, anti-wear, and anti-fatigue properties have been significantly improved.

BRIEF DESCRIPTION OF THE INVENTION

According to this invention, although the metallic mold coated with graphite or amorphous type carbon has required flatness, nitrogen ions are sputtered onto the surfaces of the super-hard mold material just before carbon coating, and the surface layer of the mold is modified.

Due to this process, it becomes possible to increase the adhesiveness of the carbon onto the mold and the life of the mold can be greatly extended.

In this invention, ion sputtering is performed to at least as much as a depth of 0.5 $\mu$m of the surface, and thereafter carbon coating is performed as much as 0.1–1$\mu$m thickness on the ion-sputtered surface. Also, the surface is treated so that the flatness reaches 2/1000–8/1000.

Further, according to this invention, glass plates for the computer photomasks are molded by using the metallic mold on which the surface has been modified by ion sputttering before coating with carbon of graphite or amorphous diamond types.

DETAILED DESCRIPTION OF THE INVENTION

Figure 1A:
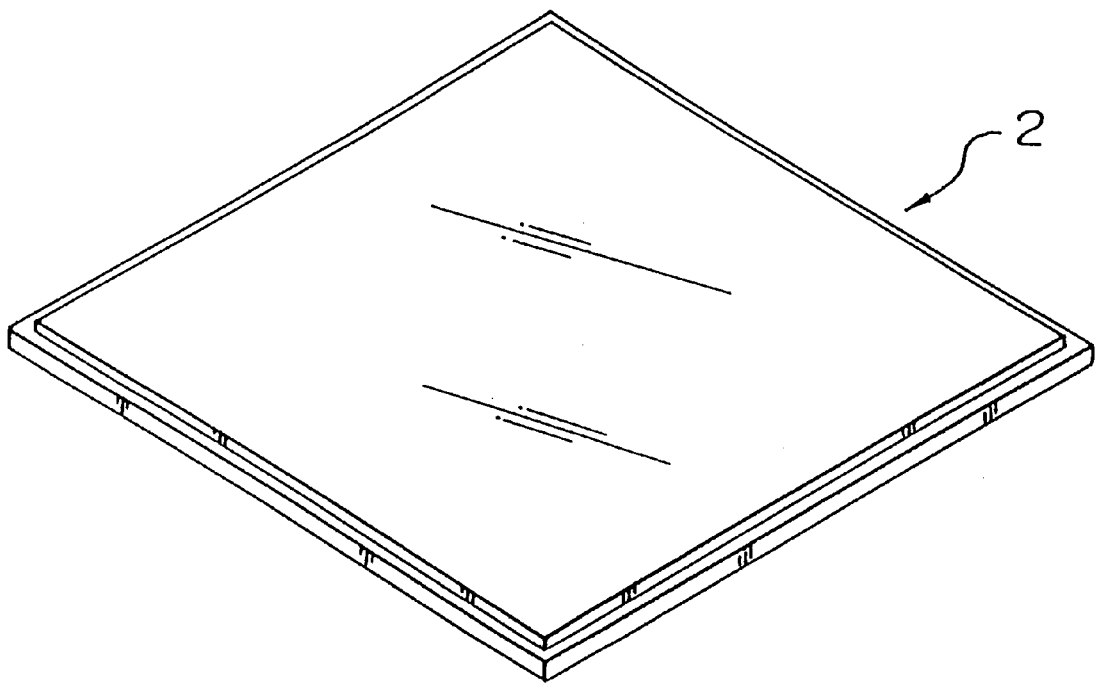
FIG. 1(a) shows a perspective view of a photomask for computers molded according to the present invention.
Figure 1B:
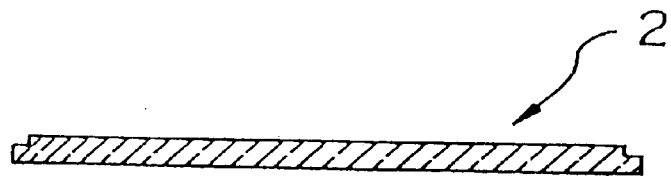
FIG. 1(b) is a cross-section of the photomask.

The embodiment of this invention is described in detail as follows. Herein, a metallic mold made of super-hard material, having a surface plane of more than 8/1000 is modified in forming Gauss distribution on the surface layer by ion sputtering such as a Nitrogen atomic ion in advance of coating with graphite or amorphous diamond-type carbon.

Namely, an ion-sputtered layer is shaped to a depth of at least as much as 0.5 $\mu$m of the surface of a super-hard alloy by ion sputtering, and then carbon coat is provided in a depth as much as 0.1 $\mu$m on the ion-sputtered layer, and the last layer of the surface is flattened so as to keep the flatness in the range of 2/1000–8/1000.

By applying the metallic mold according to this invention, it becomes possible to mold glass plates 2 for liquid crystals shown in the drawings or a Braun tube.

In the ion-sputtering method applying high frequency discharging (105–107 Hz) it becomes possible to sputter ion to a depth of as deep as at least 0.5 into the surface layer of the metallic mold by keeping ionizing current at 10 mA, ion irradiation at 100 doses, temperature at 300–500° C., and time for 10–40 seconds, and then the metallic mold is coated with an amorphous diamond type of carbon as much as a thickness of 0.1–1 $\mu$m on the ionized layer.

For example, if pressing a computer photomask glass plate by applying the metallic mold according to this invention, at first the preshaped glass plate is heated to the softening temperature of glass material, then the heated glass plate is charged in the metallic mold heated to the same temperature, and then pressed. After pressing, the pressed glass plate is gradually cooled over 15–20 minutes and cooled down to room temperature. Despite repeating 100,000 shots of this operation, peeling off of the carbon coat from the surface of the metallic mold was never seen. The effectiveness of this invention is recognized by the actual results.

The reason that the life of the metallic mold was considerably extended appears to be that the fatigue of the metallic mold is decreased by keeping glass temperature and mold temperature at the same degree, together with the improved peeling off property of the metallic mold owing to the ion radiation.

As described above in detail, in this invention, in advance of carbon coating, the shaped surface of the metallic mold is modified in the surface layer thereof by ion-sputtering, then it becomes possible to greatly increase the adhesiveness of carbon coat onto the metallic mold and to extend the life of the metallic mold, and further to eliminate the polishing step of the pressed products owing to the high-graded flatness of the molded glass plates.

What is claimed is:

1. A method for molding a glass plate for liquid crystal displays comprising:

ion sputtering a surface of a metallic mold made of super-hard material to a depth of at least 0.5 µm;

coating said ion sputtered surface with carbon to a thickness up to 0.1 to 1.0 µm to provide a required flatness thereof in a range of 2/1000 to 8/1000; and press-forming said glass plate in said metallic mold.

* * * * *